(12) United States Patent
Huang et al.

(10) Patent No.: US 8,981,429 B2
(45) Date of Patent: Mar. 17, 2015

(54) HIGH ELECTRON MOBILITY TRANSISTOR AND MANUFACTURING METHOD THEREOF

(71) Applicants: Chih-Fang Huang, Hsinchu (TW); Po-Chin Peng, Zhubei (TW); Tsung-Chieh Hsiao, Changhua (TW); Ya-Hsien Liu, Hsinchu (TW); K. C. Chang, New Taipei (TW); Hung-Der Su, Pingzhen (TW); Chien-Wei Chiu, Yunlin (TW); Tsung-Yi Huang, Hsinchu (TW); Tsung-Yu Yang, Kaohsiung (TW); Ting-Fu Chang, Taipei (TW)

(72) Inventors: Chih-Fang Huang, Hsinchu (TW); Po-Chin Peng, Zhubei (TW); Tsung-Chieh Hsiao, Changhua (TW); Ya-Hsien Liu, Hsinchu (TW); K. C. Chang, New Taipei (TW); Hung-Der Su, Pingzhen (TW); Chien-Wei Chiu, Yunlin (TW); Tsung-Yi Huang, Hsinchu (TW); Tsung-Yu Yang, Kaohsiung (TW); Ting-Fu Chang, Taipei (TW)

(73) Assignee: Richtek Technology Corporation, R.O.C., Chupei, Hsinchu ( * ) Notice: Subject to any disclaimer, the term of this patent is extended or adjusted under 35 U.S.C. 154(b) by 37 days.

(21) Appl. No.: 13/898,374

(22) Filed: May 20, 2013

(65) Prior Publication Data
US 2014/0159048 A1   Jun. 12, 2014

(30) Foreign Application Priority Data
Dec. 7, 2012   (TW) .............................. 101145965 A (51) Int. Cl.
*H01L 29/66* (2006.01)
*H01L 29/778* (2006.01)
*H01L 29/20* (2006.01)

(52) U.S. Cl.
CPC .... *H01L 29/66462* (2013.01); *H01L 29/66431* (2013.01); *H01L 29/7789* (2013.01); *H01L 29/2003* (2013.01)
USPC ............ 257/194; 257/E29.246; 257/E29.248; 257/E21.403; 257/E21.407; 438/172

(58) Field of Classification Search
CPC ................... H01L 29/66431; H01L 29/66462; H01L 29/778
USPC .......... 257/183, 192, 194, E29.246, E29.248, 257/E21.403, E21.407; 438/167, 172
See application file for complete search history.

(56) References Cited

U.S. PATENT DOCUMENTS

| | | | | |
|---|---|---|---|---|
| 5,436,474 | A * | 7/1995 | Banerjee et al. | 257/194 |
| 2004/0135169 | A1* | 7/2004 | Yoshii et al. | 257/107 |
| 2009/0057684 | A1* | 3/2009 | Otake et al. | 257/76 |
| 2009/0278172 | A1* | 11/2009 | Kaya et al. | 257/192 |
| 2010/0047976 | A1* | 2/2010 | Otake et al. | 438/197 |

* cited by examiner

*Primary Examiner* — Su C Kim
(74) *Attorney, Agent, or Firm* — Tung & Associates (57) ABSTRACT

The present invention discloses a high electron mobility transistor (HEMT) and a manufacturing method thereof. The HEMT device includes: a substrate, a first gallium nitride (GaN) layer; a P-type GaN layer, a second GaN layer, a barrier layer, a gate, a source, and a drain. The first GaN layer is formed on the substrate, and has a stepped contour from a cross-section view. The P-type GaN layer is formed on an upper step surface of the stepped contour, and has a vertical sidewall. The second GaN layer is formed on the P-type GaN layer. The barrier layer is formed on the second GaN layer. two dimensional electron gas regions are formed at junctions between the barrier layer and the first and second GaN layers. The gate is formed on an outer side of the vertical sidewall.

10 Claims, 7 Drawing Sheets

HIGH ELECTRON MOBILITY TRANSISTOR AND MANUFACTURING METHOD THEREOF

CROSS REFERENCE

The present invention claims priority to TW 101145965, filed on Dec. 7, 2012.

BACKGROUND OF THE INVENTION

1. Field of Invention

The present invention relates to a high electron mobility transistor (HEMT) and a manufacturing method thereof; particularly, it relates to an enhanced mode HEMT with a vertical channel and manufacturing method thereof.

2. Description of Related Art

Figure 1A:
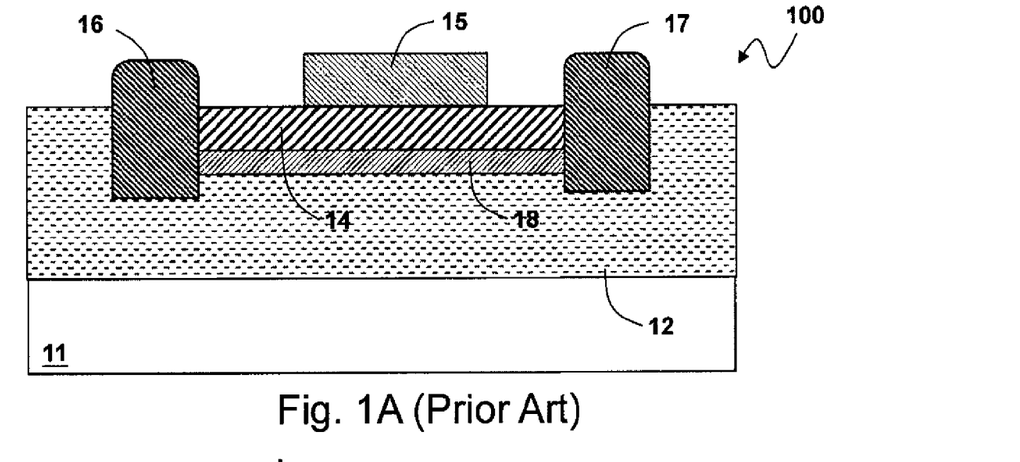
FIGS. 1A and 1B show a schematic cross-section view and a band diagram of a conventional high electron mobility transistor (HEMT) 100.
Figure 1B:
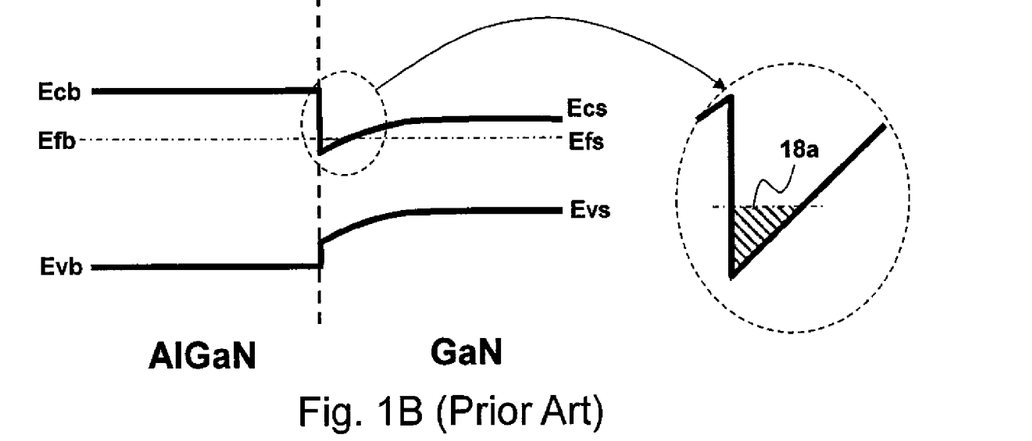

FIGS. 1A and 1B show a schematic cross-section view and an energy band diagram of a prior art high electron mobility transistor (HEMT) 100. As shown in FIG. 1A, the HEMT 100 includes a substrate 11, a gallium nitride (GaN) layer 12, an aluminum gallium nitride (AlGaN) layer 14, a gate 15, a source 16, and a drain 17. A two dimensional electron gas (2DEG) 18 is formed at a junction between the GaN layer 12 and the AlGaN layer 14, and the 2DEG 18 is electrically connected to the source 16 and the drain 17. As shown in FIG. 1B, the Fermi level Efs of the GaN layer 12 and the Fermi level Efb of the AlGaN layer 14 are at the same level. The conduction level, i.e., the lowest level of the conduction band, Ecs of the GaN layer 12 and Ecb of the AlGaN layer 14, and the valence level, i.e., the highest level of the valence band, Evs of the GaN layer 12 and Evb of the AlGaN layer 14, are bended at the junction between the GaN layer 12 and the AlGaN layer 14, such that electrons are trapped in the electron well 18a. These trapped electrons can reduce Coulomb scattering to increase the electron mobility in the 2DEG 18, such that the operation speed of the HEMT 100 is faster than a conventional semiconductor device at ON state.

However, the HEMT 100 is a depletion mode device, i.e., the gate voltage of the HEMT 100 is negative during normal operations. In practical applications, it is not convenient to adopt and operate a depletion mode device, especially in high frequency applications. A positive gate voltage of an HEMT during normal operations can decrease the complexity of the circuitry and the manufacturing cost.

Figure 2:
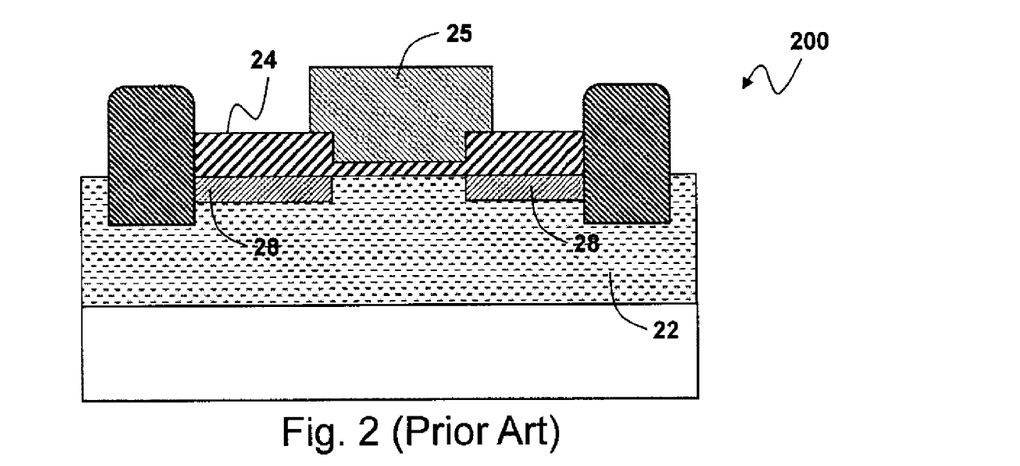
FIG. 2 shows a schematic cross-section view of another prior art HEMT 200.

FIG. 2 shows a schematic cross-section view of another prior art HEMT 200 which provides a positive gate voltage in a normal operation to solve the aforementioned problem. Referring to FIG. 2, a part of an AlGaN layer 24 beneath a gate 25 of the HEMT 200 is relatively thinner, such that a piezoelectric effect between the part of the AlGaN layer 24 beneath the gate 25 and a GaN layer 22 is different from that between the other part of the AlGaN layer 24 and the GaN layer 22, and no 2DEG 28 is formed at a junction between the part of the AlGaN layer 24 beneath the gate 25 and the GaN layer 22 initially. The two separated 2DEGs 28 become one continuous area by applying a predetermined positive voltage on the gate 25. Therefore, the HEMT 200 is normally OFF, and a gate voltage which is applied to the gate 25 of the HEMT 200 is positive during normal operations.

Even though the prior art HEMT 200 has a positive normal operation voltage, it is not easy to embody the HEMT 200 because it requires controlling the thickness of the AlGaN layer 24, which is difficult, and the normal operation voltage of the HEMT 200 cannot be stabilized at a positive constant level. Besides, the prior art HEMT 200 has another drawback of a relatively higher gate leakage current than the other prior art HEMTs.

In view of above, the present invention proposes an enhanced mode HEMT having a vertical channel and a manufacturing method thereof, to overcome the drawbacks in the prior art so that the HEMT may have a broader application range.

SUMMARY OF THE INVENTION

From one perspective, the present invention provides an HEMT, including: a substrate; a first gallium nitride (GaN) layer, which is formed on the substrate, and has a step contour with an upper step surface, a lower step surface, and a step sidewall connecting the upper step surface and the lower step surface; a first P-type GaN layer, which is formed on the upper step surface, and has a vertical sidewall; a second GaN layer, which is formed on the first P-type GaN layer; a first barrier layer, which is formed on the second GaN layer; a gate, which is formed on an outer side of the vertical sidewall, for receiving a gate voltage; and a source and a drain, which are respectively formed on the second GaN layer and the first GaN layer at two sides of the gate.

From another perspective, the present invention provides a manufacturing method of a high electron mobility transistor (HEMT), including: providing a substrate; forming a first gallium nitride (GaN) layer on the substrate, which has a step contour with an upper step surface, a lower step surface, and a step sidewall connecting the upper step surface and the lower step surface; forming a first P-type GaN layer on the upper step surface, which has a vertical sidewall; forming a second GaN layer on the first P-type GaN layer; forming a first barrier layer on the second GaN layer; forming a gate on an outer side of the vertical sidewall, which is for receiving a gate voltage; and forming a source and a drain respectively on the second GaN layer and the first GaN layer at two sides of the gate.

In one preferable embodiment, the second GaN layer includes an intrinsic GaN layer or an N-type GaN layer.

In another embodiment of the HEMT, the first barrier layer overlays the second GaN layer, the vertical sidewall, and the lower step surface; wherein two-dimension electron gas (2DEG) regions are formed at junctions between the first barrier layer and the second GaN layer, between the first barrier layer and part of the step sidewall, and between the first barrier layer and the lower step surface, and the source and the drain are respectively connected to the 2DEG region formed at the junction between the first barrier layer and the second GaN layer, and to the 2DEG region formed at the junction between the first barrier layer and the lower step surface.

In the aforementioned embodiment, the HEMT preferably includes an insulation layer, which is formed between the gate and the first barrier layer.

In the aforementioned embodiment, the HEMT preferably further includes: a third GaN layer, which overlays the first barrier layer; a second barrier layer, which overlays the third GaN layer; and an insulation layer, which overlays the second barrier layer.

In another embodiment, the HEMT may further include an insulation layer, which is formed on the lower step surface.

In another embodiment, the HEMT may further include a second P-type GaN layer, which is formed in the first GaN layer.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 3A:
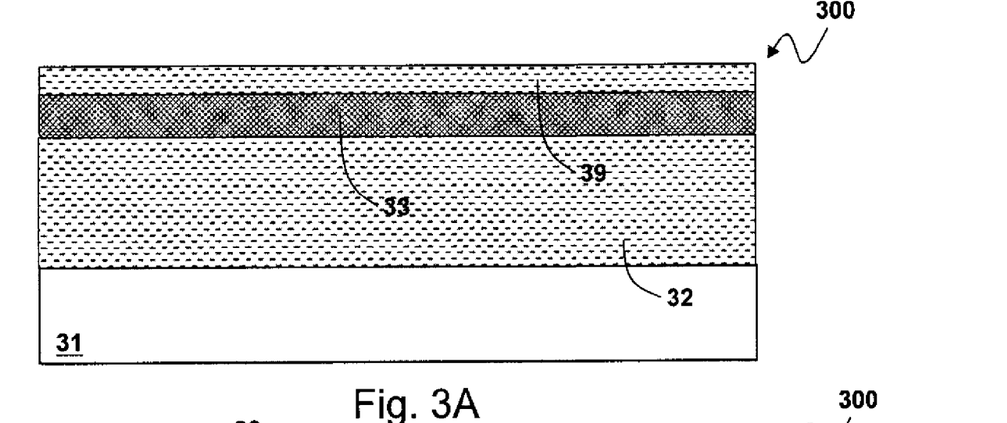
FIGS. 3A-3D show a first embodiment of the present invention.
Figure 3B:
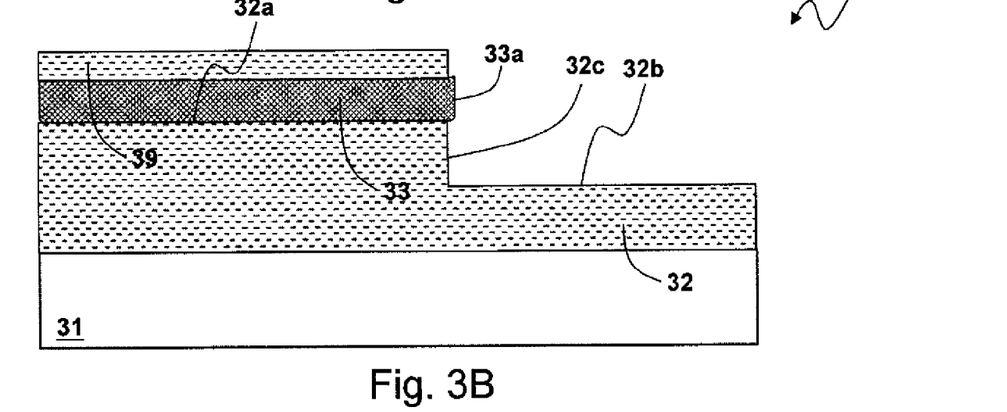

Please refer to FIGS. 3A-3D for a first embodiment according to the present invention, which illustrate a manufacturing process of a high electron mobility transistor (HEMT) 300 by cross-section views. As shown in FIG. 3A, first, a substrate 31 is provided, wherein the substrate 31 is for example but not limited to a silicon substrate, a silicon carbide substrate, or a sapphire substrate. Next, a gallium nitride (GaN) layer 32 is formed on the substrate 31 by for example but not limited to an epitaxial growth process step, and the GaN layer 32 for example is intrinsic or N-type. Next, GaN layers 33 and 39 are formed on the GaN layer 32 by for example but not limited to epitaxial growth process steps, wherein the GaN layer 33 is P-type and the GaN layer 39 is for example but not limited to intrinsic or N-type. Next, as shown in FIG. 3B, a step contour with an upper step surface 32a, a lower step surface 32b, and a step sidewall 32c connecting the upper step surface 32a and the lower step surface 32b is formed by for example but not limited to an etching process step. Therefore, as shown by the cross-section view of FIG. 3B, part of the P-type GaN layer 33 is removed by the aforementioned etching process step, and the other part of the P-type GaN layer 33 remains on the upper step surface 32a, wherein a vertical sidewall 33a of the P-type GaN layer 33 is located above the step sidewall 32c. Note that, the vertical sidewall 33a can be vertically aligned or not aligned with the step sidewall 32c substantially. In this embodiment, as shown in FIG. 3B, the vertical sidewall 33a is preferably slightly protruding from the outer surface of the step sidewall 32c, such that the gate turned-ON threshold voltage is relatively more stable, i.e., the HEMT 300 will not be turned ON when there is no sufficient voltage applied to the gate.

Figure 3C:
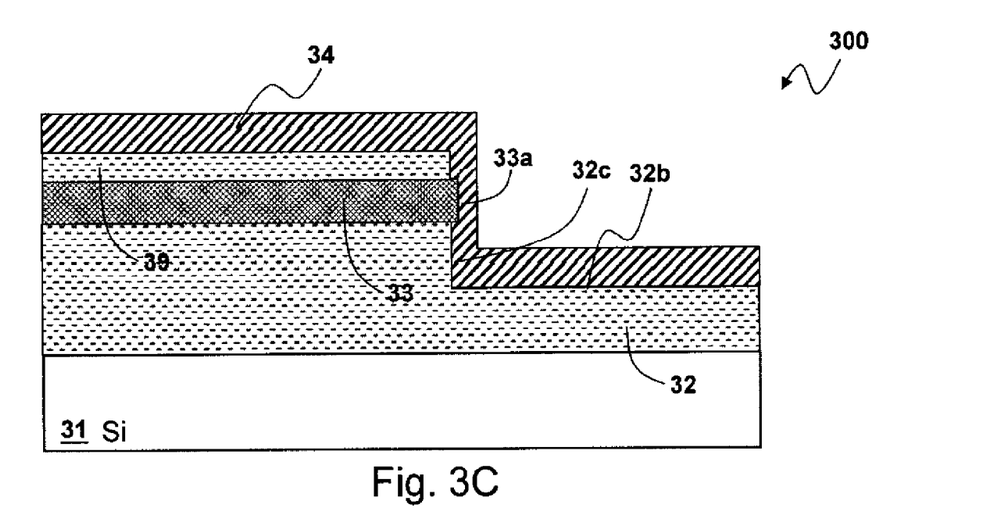
Figure 3D:
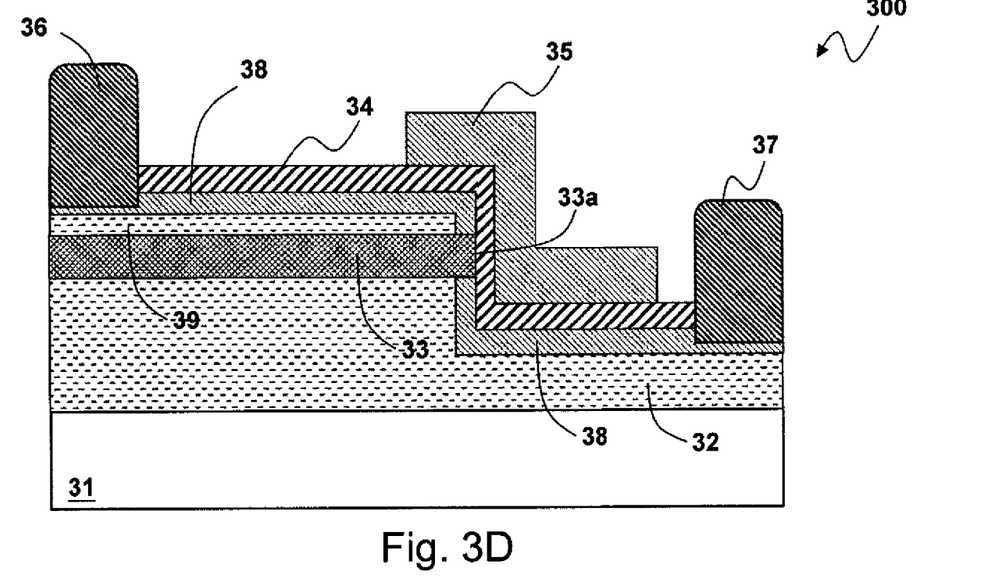

Next, as shown in FIG. 3C, a barrier layer 34 is formed on the GaN layer 39 by for example but not limited to a deposition process step, and the barrier layer 34 is connected to the GaN layer 39. The barrier layer 34 is for example but not limited to an aluminum gallium nitride (AlGaN) layer. As shown in FIG. 3C, in this embodiment, the barrier layer 34 not only overlays the GaN layer 39, but also overlays and connects to the lower step surface 32b and the step sidewall 32c of the GaN layer 32, and the vertical sidewall 33a of the P-type GaN layer 33. Referring to FIG. 3D, because of the piezoelectric effect between the barrier layer 34 and the GaN layers 39 and 32, two-dimensional electron gas (2DEG) regions 38 are formed at junctions between the barrier layer 34 and the GaN layer 39, between the barrier layer 34 and part of the step sidewall 32c, and between the barrier layer 34 and the lower step surface 32b.

Next, as shown in FIG. 3D, a gate 35, a source 36, and a drain 37 are formed. Optionally, a buck contact (not shown) can also be formed, which is electrically connected to the P-type GaN layer 33. The gate 35 is formed at the outer side the vertical sidewall 33a for receiving the gate voltage. The source 36 and the drain 37 are respectively formed on the GaN layer 39 and the GaN layer 32 at two sides of the gate 35, and the source 36 and the drain 37 are electrically connected to two ends of the 2DEG regions 38 respectively. When the gate voltage exceeds a threshold voltage, an inversion layer in the P-type GaN layer 33 is formed, and therefore a current channel is formed by the 2DEG regions 38 and the inversion layer, such that the HEMT 300 is turned ON, and an electric current is generated between the source 36 and the drain 37. On the other hand, when the gate voltage does not exceed the threshold voltage, the inversion layer is not formed in the P-type GaN layer 33, and the 2DEG regions 38 are separated by the P-type GaN layer 33, such that the HEMT 300 is OFF.

A feature of this embodiment is the step contour of the GaN layer 32, wherein a vertical channel is formed, and the 2DEG regions 38 are separated by the P-type GaN layer 33 which has a predetermined thickness, such that the HEMT 300 is an enhanced mode HEMT. The present invention is advantageous over the prior art in many aspects. For example, the length of the gate 35 is determined by the thickness of the P-type GaN layer 33, i.e., by the epitaxial process step which forms the P-type GaN layer 33. Therefore, the manufacturing cost according to the present invention is relatively lower than that of the prior art. In the prior art, the length of the gate is determined by the lithograph process step and the etching process step, etc., which require relatively higher precision and therefore higher manufacturing cost. Besides, according to the first embodiment of the present invention, the threshold voltage can be adjusted by controlling the thickness of the barrier layer 34 in the sidewall direction, and because the deposition rate of the barrier layer 34 on the sidewall is relatively lower than that on the upper and lower step surfaces, the thickness of the barrier layer 34 functioning as a gate dielectric layer can be thinner than that of the prior art. Furthermore, according to the present invention, the gate voltage is applied on the vertical sidewall 33a, so the electric fields induced by high voltages applied to the source 36 and drain 37 are more separated from one the other. In the prior art, the electric fields which are induced by high voltages applied to the source, drain, and gate will impact one another in operations of turning ON and OFF the HEMT, because they are substantially at the same vertical level. In other words, the HEMT according to the present invention can sustain a higher voltage, so the applications of the present invention are broader than that of the prior art. Note that, referring to FIG. 3B, an angle between the step sidewall 32c and the lower step surface 32b is preferably controlled in a predetermined range, so that the HEMT 300 has correct device characteristics and the later manufacturing process steps such as the deposition of the barrier layer 34 can be performed better.

Figure 4:
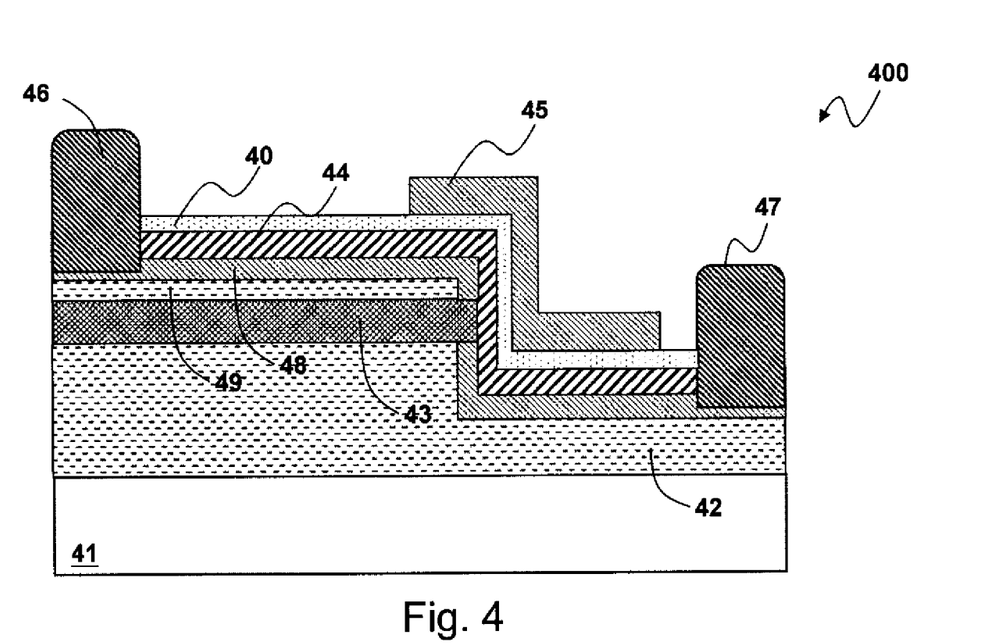
FIG. 4 shows a second embodiment of the present invention.

FIG. 4 shows a second embodiment of the present invention. This embodiment shows a schematic diagram of an HEMT 400 from cross-section view. As shown in FIG. 4, the HEMT 400 includes a substrate 41, a GaN layer 42 with a step contour, a P-type GaN layer 43, a GaN layer 49, a barrier layer 44, a gate 45, a source 46, a drain 47, and an insulation layer 40. 2DEG regions 48 are formed at junctions between the barrier 44 and the GaN layer 49, between the barrier layer 44 and the sidewall of the GaN layer 49, between the barrier layer 44 and the sidewall of the GaN layer 42, and between the barrier layer 44 and an upper surface of the GaN layer 42. This embodiment is different from the first embodiment in that, in this embodiment, the HEMT 400 further includes the insulation layer 40, which is formed between the gate 45 and the barrier layer 44, for further decreasing a gate leakage current of the HEMT 400.

Figure 5:
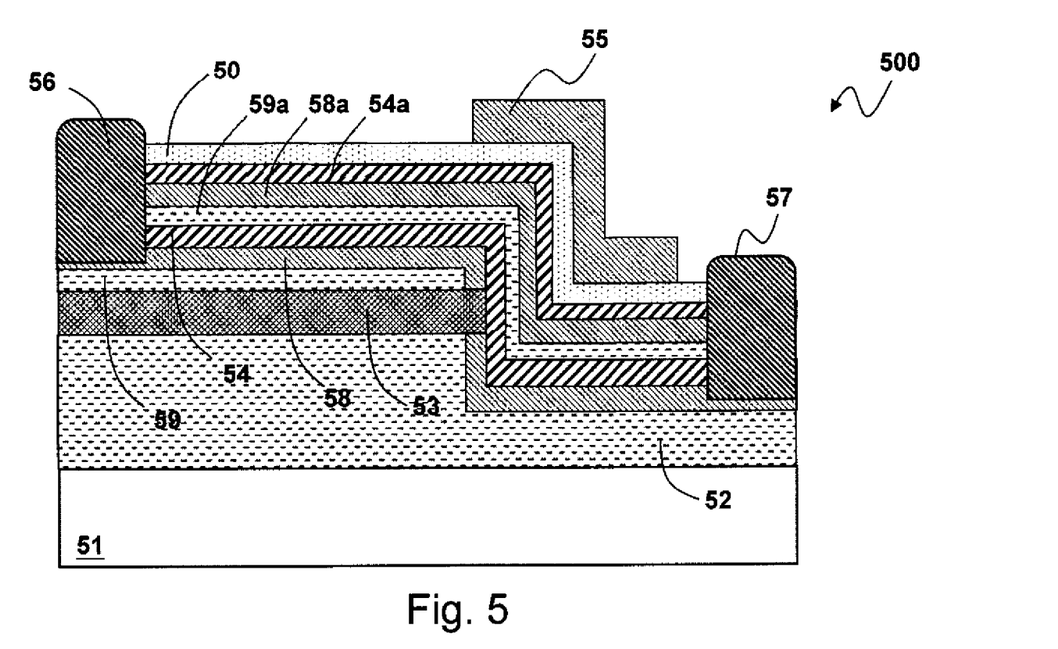
FIG. 5 shows a third embodiment of the present invention.

FIG. 5 shows a third embodiment of the present invention. This embodiment shows a schematic diagram of an HEMT 500 from cross-section view. As shown in FIG. 5, the HEMT 500 includes a substrate 51, a GaN layer 52 with the step contour, a P-type GaN layer 53, a GaN layer 59, a barrier layer 54, a GaN layer 59a, a barrier layer 54a, a gate 55, a source 56, a drain 57, and an insulation layer 50. The GaN layer 59a overlays the barrier layer 54. The barrier layer 54a overlays the GaN layer 59a. The insulation layer 50 overlays the barrier layer 54a. 2DEG regions 58 are formed at junctions between the barrier 54 and the GaN layer 59, between the barrier layer 54 and the sidewall of the GaN layer 59, between the barrier layer 54 and the sidewall of the GaN layer 52, and between the barrier layer 54 and an upper surface of the GaN layer 52. Another 2DEG region 58a is formed at a junction between the barrier 54a and the GaN layer 59a. This embodiment is different from the second embodiment in that, in this embodiment, the HEMT 500 includes two 2DEG layers (the 2DEG 58 and the 2DEG 58a) to form a dual channel. The HEMT 500 has the insulation layer 50, which is formed between the gate 55 and the barrier layer 54a.

Figure 6:
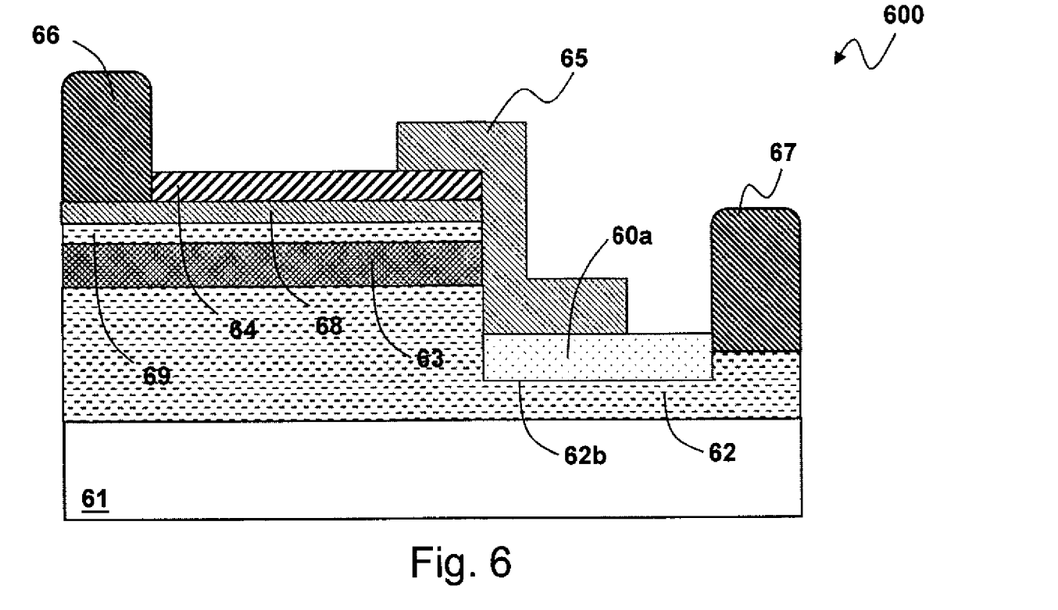
FIG. 6 shows a fourth embodiment of the present invention.

FIG. 6 shows a fourth embodiment of the present invention. This embodiment shows a schematic diagram of an HEMT 600 from cross-section view. As shown in FIG. 6, the HEMT 600 includes a substrate 61, a GaN layer 62 with the step contour, a P-type GaN layer 63, a GaN layer 69, a barrier layer 64, a gate 65, a source 66, a drain 67, and an insulation layer 60a. A 2DEG region 68 is formed at a junction between the barrier 64 and the GaN layer 69. This embodiment is different from the first embodiment in that, in the first embodiment, the barrier layer 34 overlays the lower step surface 32b, part of the step sidewall 32c, and the vertical sidewall 33a, but in this embodiment, the barrier layer 64 of the HEMT 600 only overlays the GaN layer 69; besides, the HEMT 600 of this embodiment further includes the isolation layer 60a, which is formed on the lower step surface 62b. The isolation layer 60a is for example but not limited to a local oxidation of silicon (LOCOS) structure, a shallow trench isolation (STI) structure, or being formed by implanting P-type impurities to the GaN layer 62.

Figure 7:
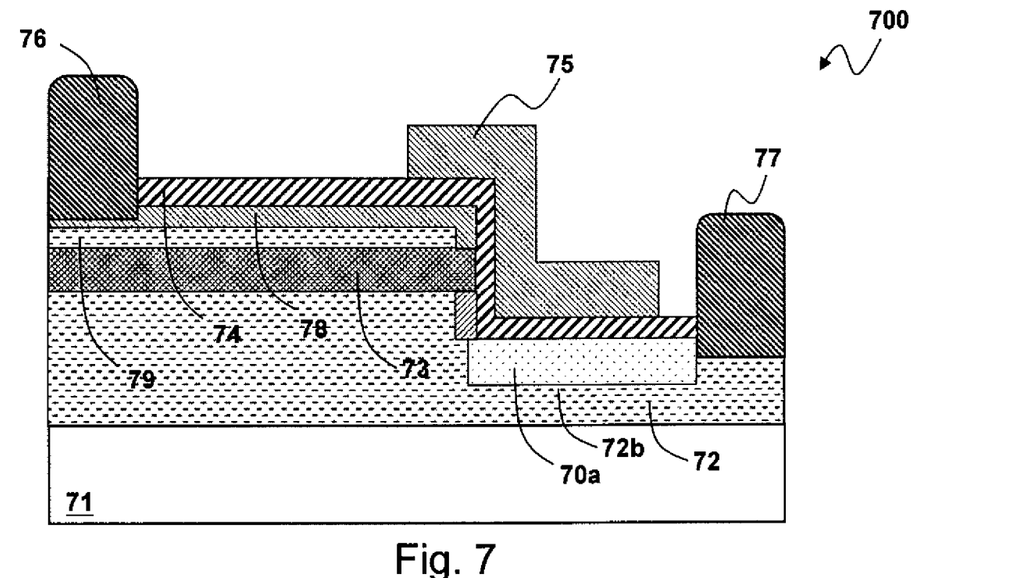
FIG. 7 shows a fifth embodiment of the present invention.

FIG. 7 shows a fifth embodiment of the present invention. This embodiment shows a schematic diagram of an HEMT 700 from cross-section view. As shown in FIG. 7, the HEMT 700 includes a substrate 71, a GaN layer 72 with the step contour, a P-type GaN layer 73, a GaN layer 79, a barrier layer 74, a gate 75, a source 76, a drain 77, and an insulation layer 70a. This embodiment is different from the fourth embodiment in that, in this embodiment, the barrier layer 74 of the HENT 700 overlays the isolation layer 70a, part of the step sidewall, and the vertical sidewall, similar to the first embodiment (the barrier layer 34 overlays the lower step surface 32b, part of the step sidewall 32c, and the vertical sidewall 33a); but because the isolation layer 70a of the HEMT 700 is formed on the lower step surface 72b, no 2DEG region is formed at the lower step surface 72b.

Figure 8:
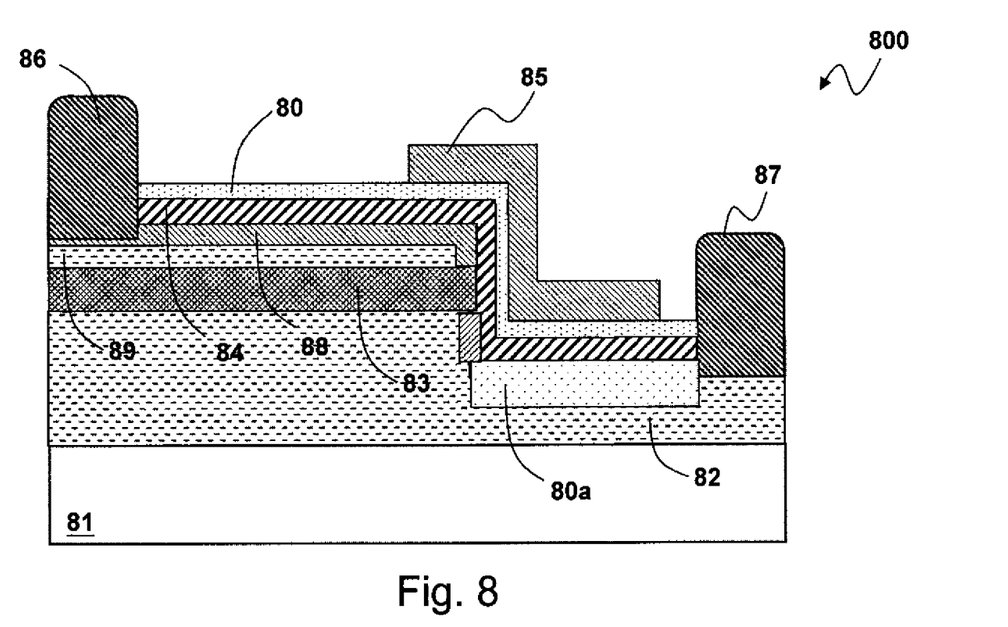
FIG. 8 shows a sixth embodiment of the present invention.

FIG. 8 shows a sixth embodiment of the present invention. This embodiment shows a schematic diagram of an HEMT 800 from cross-section view. As shown in FIG. 8, the HEMT 800 includes a substrate 81, a GaN layer 82 with the step contour, a P-type GaN layer 83, a GaN layer 89, a barrier layer 84, a gate 85, a source 86, a drain 87, and an insulation layer 80a. This embodiment is different from the fifth embodiment in that, in this embodiment, the HEMT 800 further includes the isolation layer 80a, which is formed between the gate 85 and the barrier layer 84.

Figure 9:
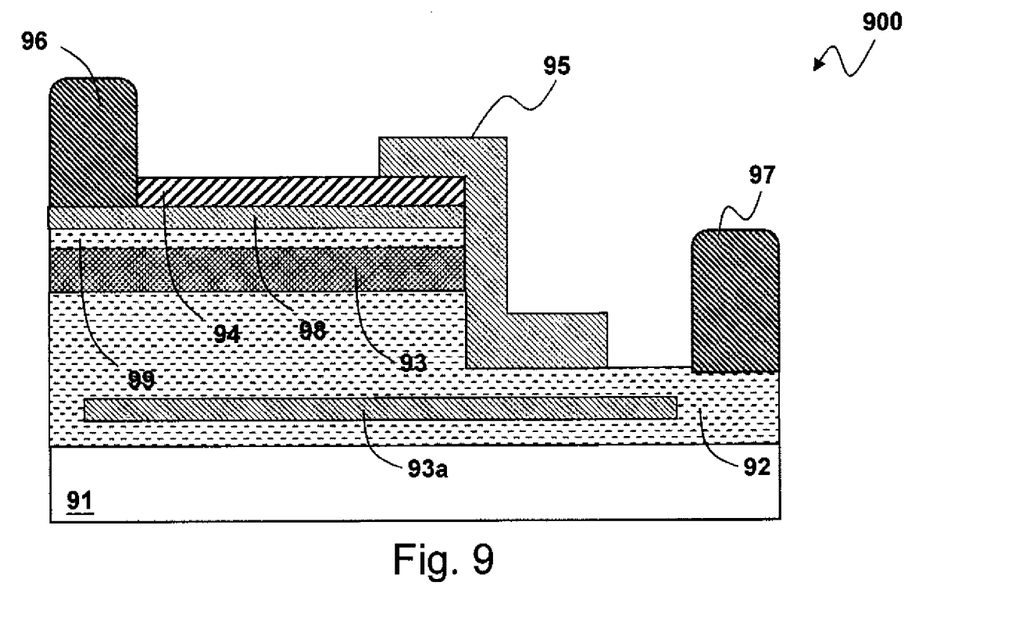
FIG. 9 shows a seventh embodiment of the present invention.

FIG. 9 shows a seventh embodiment of the present invention. This embodiment shows a schematic diagram of an HEMT 900 from cross-section view. As shown in FIG. 9, the HEMT 900 includes a substrate 91, a GaN layer 92 with a step contour, a P-type GaN layer 93, a GaN layer 99, a barrier layer 94, a gate 95, a source 96, a drain 97, and a P-type GaN layer 93a. A 2DEG region 98 is formed at a junction between the barrier 94 and the GaN layer 99. This embodiment is different from the first embodiment in that, in the first embodiment, the barrier layer 34 overlays the lower step surface 32b, part of the step sidewall 32c, and the vertical sidewall 33a, but in this embodiment, the barrier layer 94 of the HEMT 900 only overlays the GaN layer 99; besides, the HEMT 900 of this embodiment further includes the P-type GaN layer 93a, which is formed in the GaN layer 92, such that a reduced surface field (RESURF) will be formed during the operation of the HEMT 900.

Figure 10:
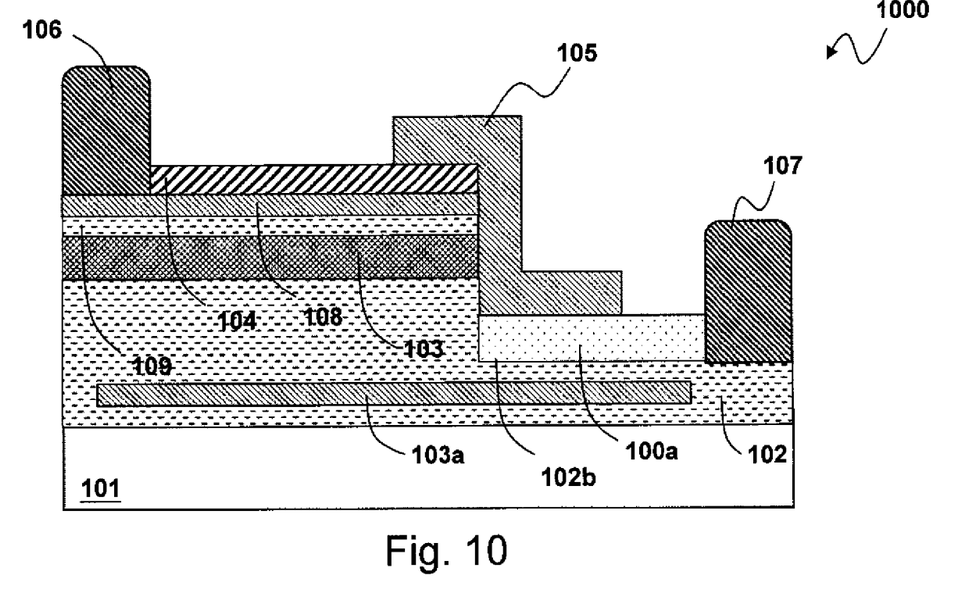
FIG. 10 shows an eighth embodiment of the present invention.

FIG. 10 shows an eighth embodiment of the present invention. This embodiment shows a schematic diagram of an HEMT 1000 from cross-section view. As shown in FIG. 10, the HEMT 1000 includes a substrate 101, a GaN layer 102 with the step contour, a P-type GaN layer 103, a GaN layer 109, a barrier layer 104, a gate 105, a source 106, a drain 107, an isolation layer 100a, and a P-type GaN layer 103a. A 2DEG region 108 is formed at a junction between the barrier 104 and the GaN layer 109. This embodiment is different from the seventh embodiment in that, in this embodiment, the HEMT 1000 further includes the isolation layer 100a, which is formed on the lower step surface 102b.

Figure 11:
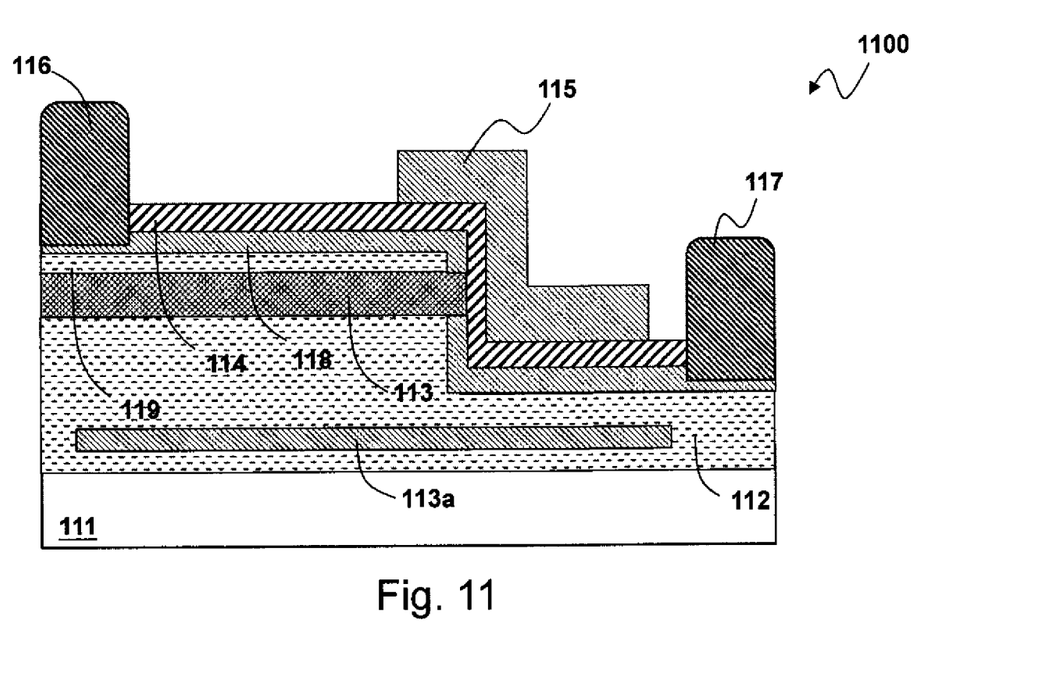
FIG. 11 shows a ninth embodiment of the present invention.

FIG. 11 shows a ninth embodiment of the present invention. This embodiment shows a schematic diagram of an HEMT 1100 from cross-section view. As shown in FIG. 11, the HEMT 1100 includes a substrate 111, a GaN layer 112 with the step contour, a P-type GaN layer 113, a GaN layer 119, a barrier layer 114, a gate 115, a source 116, a drain 117, and a P-type GaN layer 113a. 2DEG regions 118 are formed at junctions between the barrier 114 and the GaN layer 119, between the barrier layer 114 and the sidewall of the GaN layer 119, between the barrier layer 114 and the sidewall of the GaN layer 112, and between the barrier layer 114 and an upper surface of the GaN layer 112. This embodiment indicates that the P-type GaN layer 113a, which is formed in the GaN layer 112, may also be embodied in a device having a structure similar to the HEMT 300 of the first embodiment.

Figure 12:
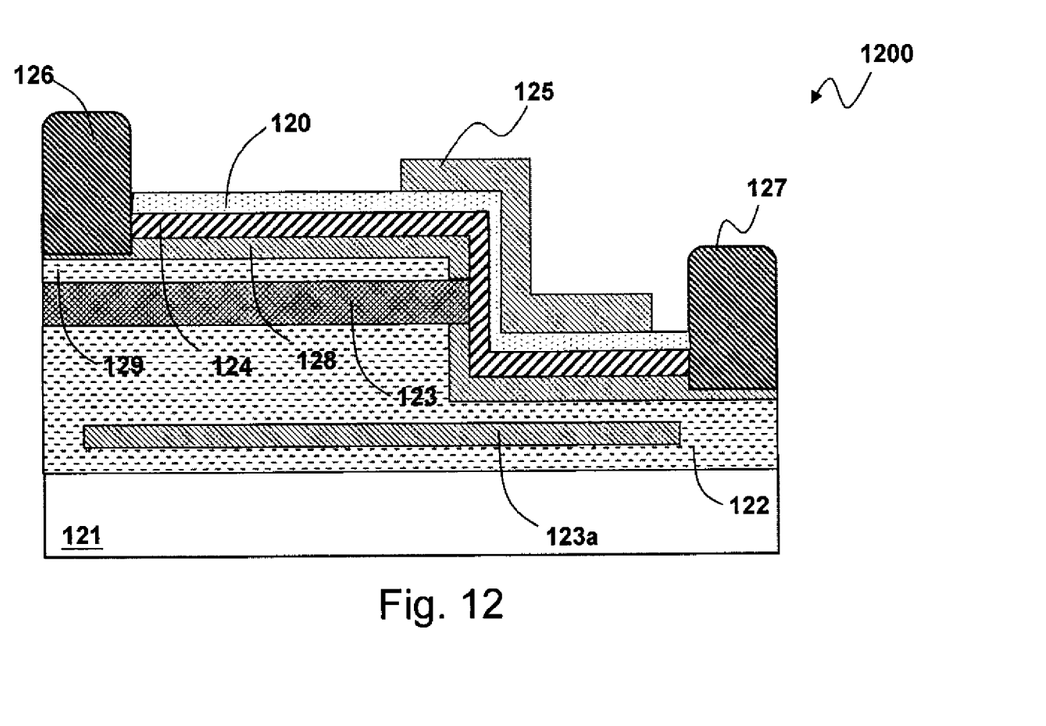
FIG. 12 shows a tenth embodiment of the present invention.

FIG. 12 shows a tenth embodiment of the present invention. This embodiment shows a schematic diagram of an HEMT 1200 from cross-section view. As shown in FIG. 12, the HEMT 1200 includes a substrate 121, a GaN layer 122 with the step contour, a P-type GaN layer 123, a GaN layer 129, a barrier layer 124, a gate 125, a source 126, a drain 127, and an insulation layer 120. 2DEG regions 128 are formed at junctions between the barrier 124 and the GaN layer 129, between the barrier layer 124 and the sidewall of the GaN layer 129, between the barrier layer 124 and the sidewall of the GaN layer 122, and between the barrier layer 124 and an upper surface of the GaN layer 122. This embodiment indicates that the P-type GaN layer 123a, which is formed in the GaN layer 122, may also be embodied in a device having a structure similar to the HEMT 400 of the second embodiment.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a passivation layer, a body region, etc., can be added. For another example, the source and the drain are interchangeable. In view of the foregoing, the spirit of the present invention should cover all such and other modifications and variations, which should be interpreted to fall within the scope of the following claims and their equivalents.

What is claimed is:

1. A high electron mobility transistor (HEMT), comprising:
    a substrate;
    a first gallium nitride (GaN) layer, which is formed on the substrate, and has a step contour with an upper step surface, a lower step surface, and a step sidewall connecting the upper step surface and the lower step surface;
    a first P-type GaN layer, which is formed on the upper step surface, and has a vertical sidewall;
    a second GaN layer, which is formed on the first P-type GaN layer;
    a first barrier layer, which is formed on the second GaN layer;
    a gate, which is formed on an outer side of the vertical sidewall, for receiving a gate voltage; and
    a source and a drain, which are respectively formed on the second GaN layer and the first GaN layer at two sides of the gate;
wherein the first barrier layer overlays the second GaN layer, the vertical sidewall, and the lower step surface; wherein two-dimension electron gas (2DEG) regions are formed at junctions between the first barrier layer and the second GaN layer, between the first barrier layer and part of the step sidewall, and between the first barrier layer and the lower step surface, and the source and the drain are respectively connected to the 2DEG region formed at the junction between the first barrier layer and the second GaN layer, and to the 2DEG region formed at the junction between the first barrier layer and the lower step surface.

2. The HEMT of claim 1, further comprising an insulation layer which is formed between the gate and the first barrier layer.

3. The HEMT of claim 1, further comprising:
    a third GaN layer, which overlays the first barrier layer;
    a second barrier layer, which overlays the third GaN layer; and
    an insulation layer, which overlays the second barrier layer.

4. The HEMT of claim 1, further comprising an isolation layer which is formed on the lower step surface.

5. The HEMT of claim 1, further comprising a second P-type GaN layer which is formed in the first GaN layer.

6. A manufacturing method of a high electron mobility transistor (HEMT), comprising:
    providing a substrate;
    forming a first gallium nitride (GaN) layer on the substrate, which has a step contour with an upper step surface, a lower step surface, and a step sidewall connecting the upper step surface and the lower step surface;
    forming first P-type GaN layer on the upper step surface, which has a vertical sidewall;
    forming a second GaN layer on the first P-type GaN layer;
    forming a first barrier layer on the second GaN layer;
    forming a gate on an outer side of the vertical sidewall, which is for receiving a gate voltage; and
    forming a source and a drain respectively on the second GaN layer and the first GaN layer at two sides of the gate;
wherein the first barrier layer overlays the second GaN layer, the vertical sidewall, and the lower step surface; wherein two-dimension electron gas (2DEG) regions are formed at junctions between the first barrier layer and the second GaN layer, between the first barrier layer and part of the step sidewall, and between the first barrier layer and the lower step surface, and the source and the drain are respectively connected to the 2DEG region formed at the junction between the first barrier layer and the second GaN layer, and to the 2DEG region formed at the junction between the first barrier layer and the lower step surface.

7. The manufacturing method of claim 6, further comprising: forming an insulation layer between the gate and the first barrier layer.

8. The manufacturing method of claim 6, further comprising:
    forming a third GaN layer, which overlays the first barrier layer;
    forming a second barrier layer, which overlays the third GaN layer; and
    forming an insulation layer, which overlays the second barrier layer.

9. The manufacturing method of claim 6, further comprising: forming an isolation layer on the lower step surface.

10. The manufacturing method of claim 6, further comprising: forming a second P-type GaN layer in the first GaN layer.

* * * * *